United States Patent
Norrie

(10) Patent No.: US 8,984,376 B1
(45) Date of Patent: Mar. 17, 2015

(54) SYSTEM AND METHOD FOR AVOIDING ERROR MECHANISMS IN LAYERED ITERATIVE DECODING

(71) Applicant: PMC-Sierra US, Inc., Sunnyvale, CA (US)

(72) Inventor: Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 132 days.

(21) Appl. No.: 13/860,411

(22) Filed: Apr. 10, 2013

Related U.S. Application Data

(60) Provisional application No. 61/781,873, filed on Mar. 14, 2013.

(51) Int. Cl.
| | | |
|---|---|---|
| *H03M 13/03* | (2006.01) | |
| *G06F 11/00* | (2006.01) | |
| *H03M 13/00* | (2006.01) | |
| *H03M 13/29* | (2006.01) | |

(52) U.S. Cl.
CPC ................................. *H03M 13/2909* (2013.01)
USPC ............ 714/772; 714/794; 714/795; 714/801

(58) Field of Classification Search
CPC ..................... H03M 13/1105; H03M 13/1177; H03M 13/1117; H03M 13/1102; H03M 13/1137; H03M 13/114; H03M 13/2963; H03M 13/2957; H03M 13/118; H04L 1/0057; H04L 1/005

USPC .......... 714/752, E11.032, 804, 195, 755, 801, 714/774, 758, 799, 795, 772, 794

See application file for complete search history.

(56) References Cited

U.S. PATENT DOCUMENTS

| | | |
|---|---|---|
| 5,732,092 A | 3/1998 | Shinohara |
| 6,115,788 A | 9/2000 | Thowe |
| 6,539,515 B1 | 3/2003 | Gong |
| 6,934,804 B2 | 8/2005 | Hashemi |
| 6,976,194 B2 | 12/2005 | Cypher |
| 6,976,197 B2 | 12/2005 | Faust et al. |
| 7,206,992 B2 | 4/2007 | Xin |
| 7,237,183 B2 | 6/2007 | Xin |
| 7,484,158 B2 | 1/2009 | Sharon et al. |
| 7,937,641 B2 | 5/2011 | Amidi |
| 7,958,430 B1 | 6/2011 | Kolokowsky et al. |
| 7,975,193 B2 | 7/2011 | Johnson |
| 8,140,930 B1 | 3/2012 | Maruo |
| 8,176,367 B2 | 5/2012 | Dreifus et al. |
| 8,219,894 B2 | 7/2012 | Au et al. |
| 8,245,112 B2 | 8/2012 | Hicken et al. |
| 8,245,117 B1 | 8/2012 | Wu |
| 8,255,770 B2 | 8/2012 | Park et al. |
| 8,261,136 B2 | 9/2012 | D'abreu et al. |
| 8,281,227 B2 | 10/2012 | Thatcher et al. |
| 8,286,004 B2 | 10/2012 | Williams |
| 8,307,258 B2 | 11/2012 | Flynn et al. |
| 8,327,220 B2 | 12/2012 | Borchers et al. |

(Continued)

*Primary Examiner* — Phung M Chung
(74) *Attorney, Agent, or Firm* — Kenneth Glass; Molly Sauter; Glass & Associates

(57) ABSTRACT

A low-density parity check (LDPC) decoder is provided for decoding low-density parity check (LDPC) encoded data wherein the processing order of the layers of the LDPC parity check matrix are rearranged during the decode process in an attempt to avoid error mechanisms brought about by the iterative nature of the LDPC belief propagation decoding process, such as stopping sets and trapping sets.

21 Claims, 9 Drawing Sheets

(56) References Cited

U.S. PATENT DOCUMENTS

| | | | |
|---|---|---|---|
| 8,335,977 | B2 | 12/2012 | Weingarten et al. |
| 8,359,522 | B2 | 1/2013 | Gunnam et al. |
| 8,392,789 | B2 | 3/2013 | Biscondi et al. |
| 8,402,201 | B2 | 3/2013 | Flynn et al. |
| 8,418,023 | B2 * | 4/2013 | Gunnam et al. ............. 714/758 |
| 8,429,497 | B2 | 4/2013 | Tu et al. |
| 8,504,887 | B1 * | 8/2013 | Varnica et al. ............... 714/730 |
| 8,555,140 | B2 * | 10/2013 | Gunnam et al. ............. 714/758 |
| 8,621,318 | B1 | 12/2013 | Micheloni et al. |
| 8,656,257 | B1 | 2/2014 | Micheloni et al. |
| 8,694,849 | B1 | 4/2014 | Micheloni et al. |
| 8,694,855 | B1 | 4/2014 | Micheloni et al. |
| 8,707,122 | B1 | 4/2014 | Micheloni et al. |
| 2003/0033567 | A1 | 2/2003 | Tamura et al. |
| 2003/0104788 | A1 | 6/2003 | Kim |
| 2003/0225970 | A1 | 12/2003 | Hashemi |
| 2004/0088636 | A1 | 5/2004 | Cypher |
| 2004/0123230 | A1 | 6/2004 | Lee et al. |
| 2004/0181735 | A1 | 9/2004 | Xin |
| 2004/0252791 | A1 | 12/2004 | Shen et al. |
| 2005/0248999 | A1 | 11/2005 | Tamura et al. |
| 2007/0050688 | A1 | 3/2007 | Thayer |
| 2007/0089031 | A1 | 4/2007 | Huffman et al. |
| 2008/0005382 | A1 | 1/2008 | Mimatsu |
| 2008/0016425 | A1 | 1/2008 | Khan et al. |
| 2008/0229079 | A1 | 9/2008 | Flynn et al. |
| 2008/0229164 | A1 | 9/2008 | Tamura et al. |
| 2008/0256292 | A1 | 10/2008 | Flynn et al. |
| 2008/0276156 | A1 * | 11/2008 | Gunnam et al. ............. 714/801 |
| 2009/0327802 | A1 | 12/2009 | Fukutomi |
| 2010/0199149 | A1 | 8/2010 | Weingarten |
| 2010/0211737 | A1 | 8/2010 | Flynn et al. |
| 2010/0211852 | A1 | 8/2010 | Lee et al. |
| 2010/0246664 | A1 | 9/2010 | Citta et al. |
| 2010/0293440 | A1 | 11/2010 | Thatcher |
| 2011/0055659 | A1 | 3/2011 | Tu et al. |
| 2011/0072331 | A1 | 3/2011 | Sakaue et al. |
| 2011/0246853 | A1 | 10/2011 | Kim |
| 2011/0296084 | A1 | 12/2011 | Nango |
| 2012/0054413 | A1 | 3/2012 | Brandt |
| 2013/0163328 | A1 | 6/2013 | Karakulak et al. |
| 2014/0053037 | A1 * | 2/2014 | Wang et al. ................... 714/752 |
| 2014/0072056 | A1 | 3/2014 | Fay |

\* cited by examiner

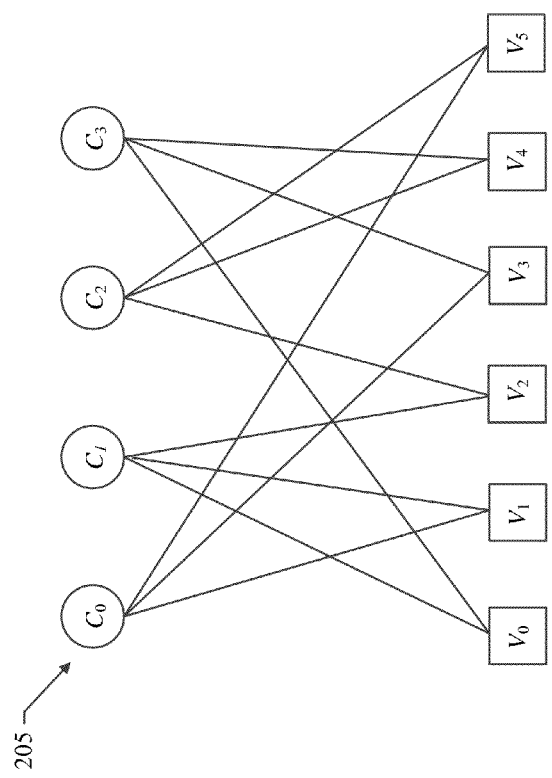

SYSTEM AND METHOD FOR AVOIDING ERROR MECHANISMS IN LAYERED ITERATIVE DECODING

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column.

Various methods for decoding data encoded with LDPC error correction codes are known in the art, including the sum-product algorithm (SPA) and the min-sum algorithm (MSA). While the sum-product algorithm (SPA) is known to achieve the best decoding performance, it is computationally complex. The min-sum algorithm (MSA) was introduced to reduce the computationally complexity inherent in the sum-product algorithm. Additionally, one commonly employed decoding method for LDPC coding, comprising a further hardware simplification, is the layered min-sum algorithm (MSA). The layered min-sum algorithm is iterative by layer of the parity check matrix.

While the layered min-sum algorithm performs very well utilizing layered iterative decoding based on belief propagation, the combination of the structure of the parity check matrix used for the encoding of the data and the decoding process itself may result in the undesirable creation of error mechanisms, such as trapping sets and stopping sets during the iterative decoding process. These undesirable error mechanisms may force the decoder to converge to an incorrect result, leading to undesired retransmission of the frame or undesired noise at the receiver.

Accordingly, what is needed in the art is an improved system and method for reducing the effect of error mechanisms, such as trapping sets and stopping sets, on a belief propagation algorithm for decoding LDPC encoded data.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A low-density parity check (LDPC) decoder is provided for decoding low-density parity check (LDPC) encoded data wherein the processing order of the layers of the LDPC parity check matrix are rearranged during the decode process in an attempt to avoid error mechanisms, such as stopping sets and trapping sets.

In accordance with an embodiment of the present invention, a method for avoiding an error mechanism during the decoding of encoded data, such as low-density parity check (LDPC) encoded data, is provided. The method includes, receiving a plurality of log-likelihood ratios (LLRs) at a decoder, each of the plurality of LLRs representing one of a plurality of bits of an LDPC codeword encoded using a parity check matrix having a plurality of layers. The present invention performs iterative decoding of the LLRs utilizing a layered iterative decoding process following a first processing order of the plurality of layers of the parity check matrix to provide a codeword estimate of the LDPC encoded codeword until the codeword estimate is determined to be a valid codeword or until a maximum number of iterations of the iterative decoding is reached. If a maximum number of iterations of the iterative decoding is reached and the codeword estimate is not a valid codeword, performing iterative decoding of the LLRs utilizing a layered iterative decoding process following a second processing order of the plurality of layers of the parity check matrix that is different than the first processing order of layers to provide a codeword estimate of the LDPC encoded codeword until the codeword estimate is determined to be a valid codeword or until the maximum number of iterations of the iterative decoding is reached.

In a particular embodiment, the layered iterative decoding process utilized by the present invention may be a layered min-sum decoding process, or a layered sum-product decoding process. The decoding may be performed over multiple iterations, wherein a different processing order of the plurality of layers of the parity check matrix is followed for each of the iterations of the layered iterative decoding process until a valid codeword is found or the maximum number of iterations has been reached.

By reordering the processing of the layers of the parity check matrix, various error mechanisms may be avoided, such as stopping sets, trapping sets, or any condition arising during the decoding process wherein the processing order of the layers of the parity check matrix contributes to the inability of the decoding process to converge to a valid codeword.

An LDPC decoder for decoding low-density parity check (LDPC) encoded data is provided for LDPC encoded data comprising a plurality of log-likelihood ratios (LLRs), each of the plurality of LLRs representing one of a plurality of bits of an LDPC codeword encoded using a parity check matrix having a plurality of layers. The LDPC decoder of the present invention includes decoding circuitry for avoiding error mechanisms, such as stopping sets and trapping sets. To avoid the error mechanisms, the decoder includes circuitry for performing iterative decoding of the LLRs utilizing a layered iterative decoding process following a first processing order of the plurality of layers of the parity check matrix to provide a codeword estimate of the LDPC encoded codeword until the codeword estimate is a valid codeword or until a maximum number of iterations of the iterative decoding is reached and if the maximum number of iterations of the iterative decoding has been reached and the codeword estimate is not a valid codeword, performing iterative decoding of the LLRs utilizing a layered iterative decoding process following a second processing order of the plurality of layers of the parity check matrix that is different than the first processing order of layers to provide a codeword estimate of the LDPC encoded codeword until the codeword estimate is a valid codeword or until the maximum number of iterations of the decoding is reached.

The decoder may further include a layer ordering circuit for determining the first processing order and the second processing order of the plurality of layers of the parity check matrix and the decoding may be performed over multiple iterations and wherein the layer ordering circuit identifies a different processing order of the plurality of layers of the parity check matrix to be followed for each iteration of the layered iterative decoding process.

The decoder may include a check node processor having circuitry for performing check node processing for each layer of the parity check matrix associated with the LDPC encoded codeword following the first processing order of the plurality of layers of the parity check matrix, a variable node processor coupled to the check node processor, the variable node processor having circuitry for performing variable node processing for each layer of the parity check matrix following the first processing order of the plurality of layers of the parity check matrix and a codeword estimate check processor coupled to the variable node processor, the codeword estimate check processor having circuitry for performing a check of the estimate of the LDPC encoded codeword to determine if the codeword estimate is a valid codeword.

The present invention provides an improved system and method for the avoidance of error mechanisms, such as stopping sets and trapping sets, during the layered iterative decoding of encoded data.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 2A is an illustration of a parity check matrix of a regular LDPC code.

FIG. 2B is an illustration of the Tanner Graph of the parity check matrix of FIG. 2A

DETAILED DESCRIPTION

Figure 1:
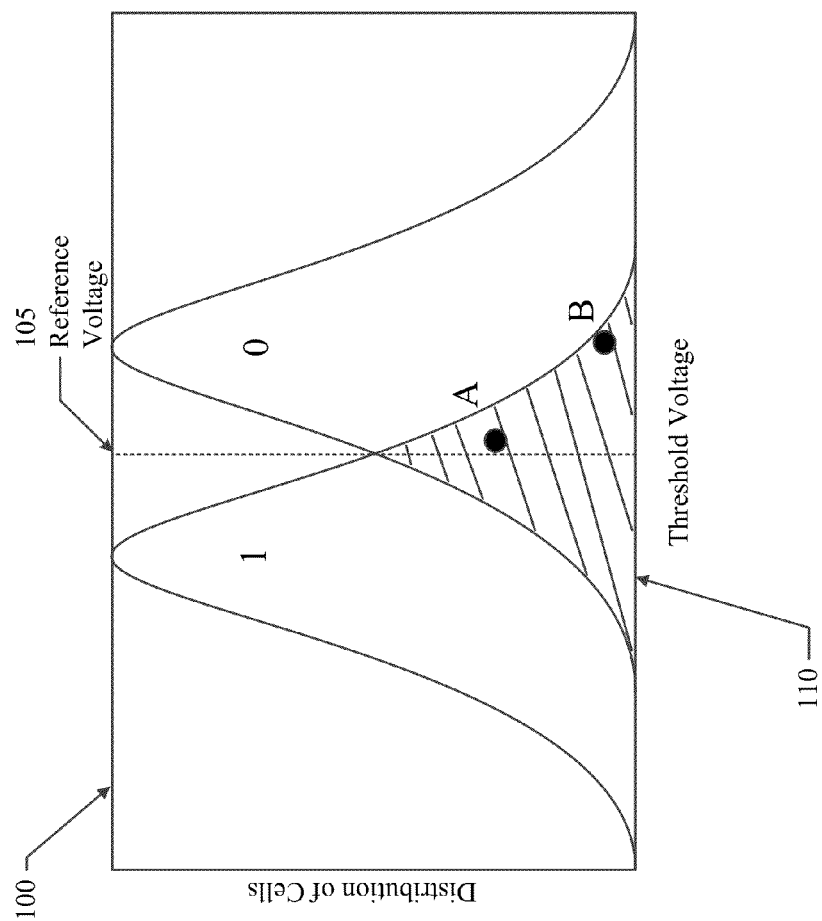
FIG. 1 is graphical illustration of the distribution overlap in the two voltage distributions used for decoding.

In the operation of a stored channel utilizing LDPC encoding, original data are stored in a non-volatile memory. Different noise sources estimated as Additive White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

The power of LDPC codes resides in the ability of the decoding strategy to exploit the soft information of the stored data. In LDPC decoding of single-level (SLC) flash memory, the two voltage distributions represent the two possible states, "0" and "1", of the cells within the NAND chips. When the voltage distributions overlap 110, as shown with reference to the graph 100 of FIG. 1, errors arise. A hard-decision decoder will read all the values to the right of the reference voltage 105 as 0 and all the values to the left of the reference voltage 105 as 1. So, in the situation depicted in the graph 100, the overlap region 110 will be composed of read errors. However, observing error points A and B within the overlap region 105, it is clear that the error points may vary in magnitude. The farther away the error points are from the reference voltage 105, the more probable it is that the cell contains the value that was stored. For example, point A is slightly to the right of the reference voltage and as such, slightly positive, while point B is farther away from the reference voltage 105. As such, it is more likely that point A carries the greater error because correct values should not be close to the reference voltage. Alternatively, point B is considered to carry less error than point A and is more likely to be read correctly. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log-likelihood ratio (LLR). As such, in FIG. 1, error point A would be presented to the LDPC decoder as a value of zero and assigned a low magnitude LLR (probability) due to its close proximity to the reference voltage 105, whereas error point B would be presented to the LDPC decoder as a value of zero and assigned a moderate magnitude LLR (probability) due to its greater distance from the reference voltage 105. The read errors are not binary in nature, but instead vary away from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude. LDPC decoding is performed based upon a parity check matrix which consists of "0"s and "1"s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the LLR of the received data bits in the codeword, as in the equation:

$$LLR(x) = \log\left[\frac{p(x \mid y = 0)}{p(x \mid y = 1)}\right]$$

where "x" is the read message and "y" is the original codeword. As such, the LLR for a particular read value of "y" is the logarithmic ratio between the probability that the bit of the original codeword "x" was a 0 given the read value "y" and the probability that the bit "x" was a 1 given the read value "y". As such, the magnitudes of the LLRs measure the probability that the bit is read correctly vs. the probability that the bit is read incorrectly. When performing decoding of the codeword, the LLRs are propagated and updated between the variable nodes and the check nodes in a Tanner graph, which is representative of the parity check matrix of the LDPC code.

With reference to FIGS. 2A and 2B, it is useful to think of the parity check matrix 200 of FIG. 2A used for LDPC decoding in terms of its equivalent Tanner graph 205, shown in FIG. 2B. A Tanner graph is a bipartite graph used to state constraints or equations which specify error correcting codes. In a Tanner graph representative of the parity check matrix, there are M=N–K check nodes C, one check node for each check equation, and N variable nodes, one variable node for each codeword bit. During the decoding process, the M check nodes and N variable nodes iteratively exchange information between themselves according to the LDPC decoding algorithm. The "1"s in the parity check matrix determine the connections between the check nodes and the variable nodes. Iterative information exchange is performed only between the check nodes and the variable nodes that are connected to each other as defined in the parity check matrix.

Figure 3B:
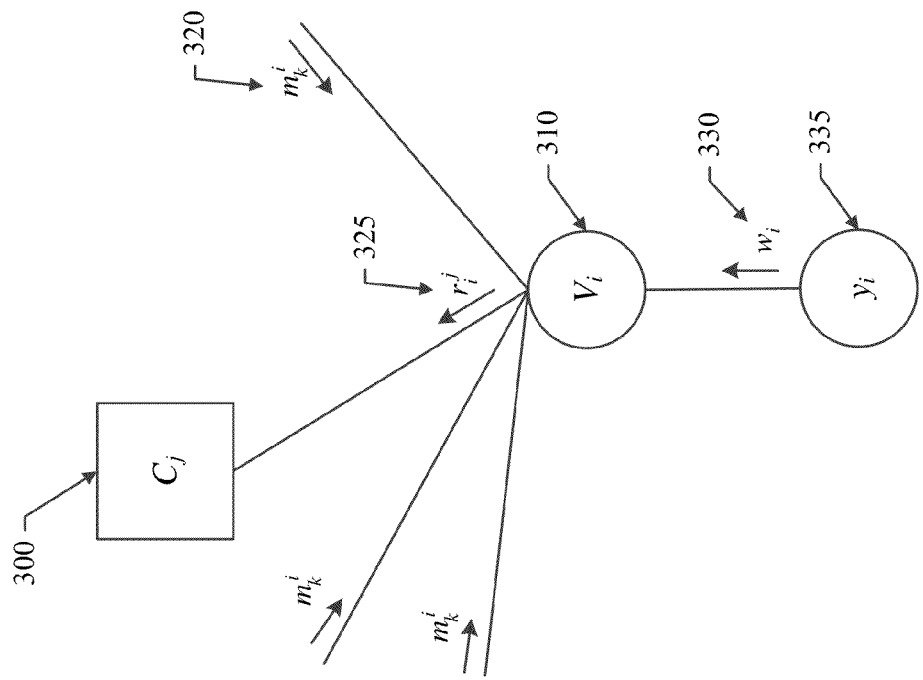
FIG. 3B is a diagram illustrating variable node processing within an LDPC parity check matrix.
Figure 3A:
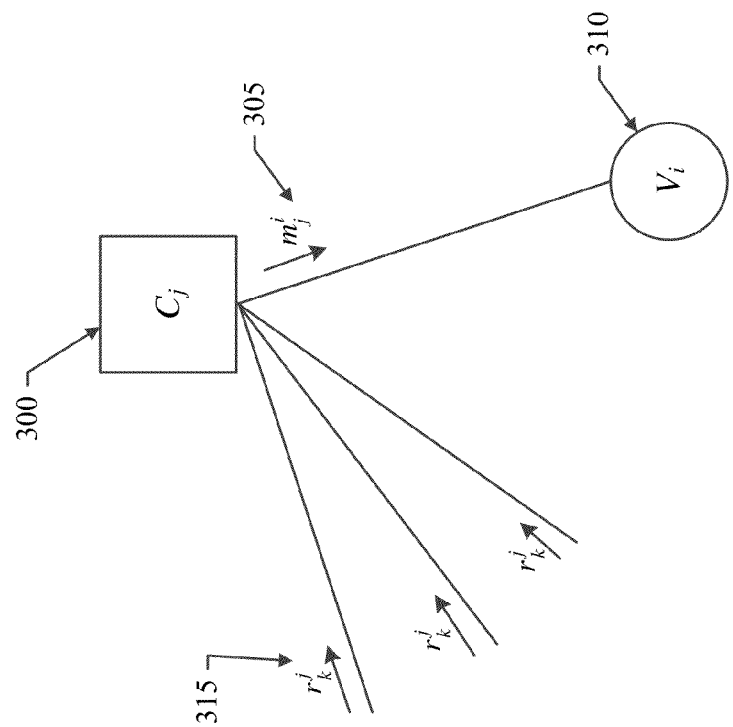
FIG. 3A is a diagram illustrating check node processing within an LDPC parity check matrix.

In the check node processing phase of the decoding as illustrated in FIG. 3A, each check node ($C_j$) 300 computes values ($m_j^i$) 305 to be sent to the variable nodes ($V_i$) 310 to which the check node 300 is connected as defined by the parity check matrix. Each time the check node 300 computes the value 305, only extrinsic information is taken into account. In other words, the value $m_i$ is computed using all the values sent by the variable nodes connected to that check node $r_k^j$ 315, except variable node i, according to the following formulas:

$$m_j^i = \prod_{k \in N(j)\setminus\{i\}} \text{sign}(r_k^j) \cdot \phi\left(\sum_{k \in N(j)\setminus\{i\}} \phi(|r_k^j|)\right)$$

$$\phi(x) = -\log\left(\tanh\left(\frac{x}{2}\right)\right)$$

A similar concept is applied to variable node processing in accordance with the parity check matrix as shown with reference to FIG. 3B. In variable node processing, the value $r_j$ 325, representing the codeword estimate, is computed using all the values $m_k^i$ 320 sent by the check nodes connected to the variable node 310, except check node j 300 and the input LLRs 330 read from the NAND cells 335, according to the following formula:

$$r_j^i = w_i + \sum_{k \in N(i)\setminus\{j\}} m_k^i$$

Following every iteration of the check node processing and variable node processing steps, the resulting codeword estimate (r) is checked to verify that it is a codeword by multiplying it by the transpose of the parity check matrix (H). If the result is null, then r is a considered a codeword and the decoding is complete. If the result is not null, then the decoding is not considered complete and a new iteration is started.

The message passing computation rule procedure as described above is referred to as a belief propagation (BP) computation rule and is also commonly known as the sum-product algorithm (SPA). While the sum-product algorithm is known to achieve the best decoding performance, it is computationally complex. The formula used in check node processing following the sum-product algorithm is a very complex formula involving both the tan h and the log function which are difficult to implement in hardware necessary to compute the check node formula. The computational complexity of the SPA necessitates a decoding device having a large number of logic gates, resulting in an increased cost and decreased power efficiency of the device.

In the sum-product algorithm, the φ function produces a very large result for small values of x (read messages) and a very small result for large values of x (read messages). In general, as x approaches zero, φ(x) approaches infinity and as x increases from zero, φ(x) rapidly decreases in value.

When a check node receives the extrinsic information it operates on, the majority of the information will have originated from reasonably reliable sources, because most of the variable nodes associated with the check node will have large LLR magnitudes, representing a high probability that the message read from the memory is the original codeword that was stored. When only a small amount of noise has affected the stored bits, and as such the raw bit error rate (RBER) is low, the majority of LLRs will tend to have a large magnitude, while only a few LLRs will have a small magnitude. For example, at a raw bit error rate (RBER) of 1e-3, an average of only 1 in 1000 bits is in error. As such, all the extrinsic information operated on by the check nodes will have large LLR magnitudes except for the check nodes that process bits that are in error. However, even in the case where the check node is processing bits that are in error, it is likely that only 1 of the extrinsic sources for that particular check node has a small LLR magnitude. The small LLR magnitude of that one extrinsic source will have the greatest effect on the φ function, as previously discussed. As a result of the complexity of the sum-product algorithm, and the assumption that the smallest extrinsic value approximates all extrinsic values received by a check node, approximated decoders utilizing a min-sum algorithm (MSA) have been developed where the φ function is computed as a minimum among the magnitudes of a set of values according to the formula:

$$m_j^i = \prod_{k \in N(j) \setminus \{i\}} \text{sign}(r_k^j) \cdot \min_{k \in N(j) \setminus \{i\}} |r_k^j|$$

However, since utilizing this formula yields an approximation to the full sum-product algorithm (SPA), an attenuation, or normalization, factor (α) is introduced into the MSA computation as:

$$m_j^i = \alpha \cdot \prod_{k \in N(j) \setminus \{i\}} \text{sign}(r_k^j) \cdot \min_{k \in N(j) \setminus \{i\}} |r_k^j|$$

In the normalized min-sum algorithm, the complicated computation of the tan h function and the log function are replaced with a simple minimum value finding operation at the cost of decoding performance. The loss of decoding performance is then recovered by applying a normalizing factor or attenuation factor to the check node processing outputs to improve the error performance.

For example, assuming a typical low noise situation wherein one small magnitude LLR and three larger magnitude LLRs are received as a series of four extrinsics as 0.1, 3, 3 and 3. The associated φ(x) for these received extrinsics would be 3.00, 0.01, 0.01 and 0.01, respectively, then the sum of the φ values for these extrinsics would be equal to 3.03 and the φ of the sum would be equal to about 0.1. The min-sum estimate would also result in a value of 0.1 by ignoring the last three LLRs (3, 3, 3) and considering only the first LLR (0.1). As such, in a low noise situation the assumption can be made that the smallest extrinsic value approximates all extrinsic values received by a check node and the min-sum algorithm will provide a close approximation without requiring any additional attenuation. In general, very little attenuation is required in a low noise situation. In contrast, in a higher noise situation wherein a series of four received extrinsics are 0.1, 1, 1 and 1, the sum of the φ of the received extrinsics is 3+(3*0.77)=5.3 and φ(5.3) is equal to 0.01, the output of the check node processing utilizing SPA is 0.01. However, utilizing the min-sum approximation, the output of the check node processing would be equal to 0.1, which is not a close approximation to the SPA result. As such, in a higher noise situation, the min-sum result will require greater attenuation to more closely approximate the SPA result. In general, attenuating the min-sum result when there is more noise tends to increase the accuracy of the approximation towards the correct check node result.

While in the case of low RBER the min-sum approximation closely approximates the sum-product algorithm (SPA), in the case of high RBER, the approximation may not resemble the sum-product algorithm because the assumption that only 1 extrinsic is small may not be accurate. As such, in the case of high RBER, the min-sum check node calculation may be a poor approximation to the real φ function result of the sum-product algorithm (SPA). In the case of high RBER, the full min-sum check node calculation will generate a result that is noticeably larger than the sum of φ result of the sum-product algorithm, which translates to a higher than optimal estimate of the likelihood of which bits are in error versus which are not in error. As such, at high RBER the min-sum calculation tends to be overly optimistic when compared to the sum-product calculation.

The error performance of the LDPC decoder can be further improved by using an iterative layered decoding technique which achieves a faster decoding convergence due to the optimized scheduling of the message passing between check nodes and variable nodes.

In non-layered scheduling for min-sum LDPC decoding, all of the check node processing is performed prior to initiating the variable node processing. Alternatively, in layered scheduling for min-sum LDPC decoding, the iterative decoding process of the normalized min-sum layered algorithm is performed layer by layer. With layered LDPC decoding, the parity-check matrix may be viewed as group of horizontal layers, each horizontal layer representing the check nodes for one layer. In layered scheduling, once the processing has been completed for all the check nodes of a first layer, the processing may immediately switch to the variable node processing. In this way, the computations for the check nodes of the second layer utilizes an input that is more likely to have larger LLRs as compared to the initial values utilized in the computations of the first layer. As such, in layered min-sum LDPC decoding, after the check nodes complete the min-sum algorithm for the variable nodes they are connected to in the first layer, these variable nodes are updated and the check nodes utilize these updated messages to complete the min-sum algorithm for the second layer.

It is known that layered belief propagation decoding schemes, such as layered min-sum LDPC decoding and layered sum-product LDPC decoding, are susceptible to error mechanisms as a result of their iterative nature. As an example, for two LDPC H matrices of the same specification, but with a different arrangement of elements in the matrix, one LDPC H matrix may lead to a decode success, while the other LDPC H matrix may lead to a decode failure. In addition, for any given error vector, it may be either one of the LDPC H matrices that leads to a decode failure. Two of the error mechanisms identified as being responsible for the decode failures that result from iterative LDPC decoding schemes have been identified in the literature as stopping sets and trapping sets.

Figure 4:
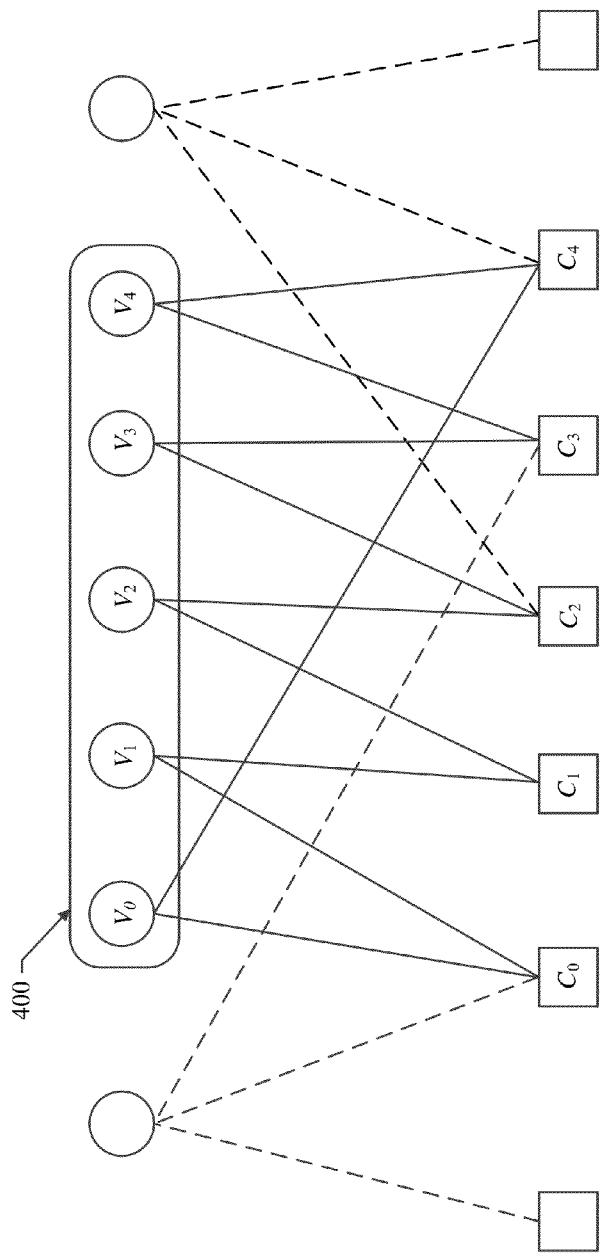
FIG. 4 is an illustration of a Tanner Graph of a stopping set in an LDPC code.

Stopping sets are often associated with the binary erasure channel (BEC) and a stopping set is generally defined as a subset of the set of variable nodes, such that any check node connected to a variable node contained in the stopping set is connected to at least two variable nodes in the stopping set. An exemplary stopping set 400 is illustrated with reference to FIG. 4. As shown in FIG. 4, the five check nodes ($C_0$, $C_1$, $C_2$, $C_3$ and $C_4$) are connected to the variable nodes of the stopping set 400 exactly two times. As such, the stopping set 400 comprising these five check nodes ($C_0$, $C_1$, $C_2$, $C_3$ and $C_4$) and these five variable nodes ($V_0$, $V_1$, $V_2$, $V_3$ and $V_4$) will form an incorrect belief that a bit is not in error and this incorrect belief may not be overcome by the other check nodes that are connected to these variable nodes ($V_0$, $V_1$, $V_2$, $V_3$ and $V_4$). The message passing between the check nodes and the variable nodes in the stopping set 400 continues to confirm the internal belief of the stopping set 400 which is very difficult for external beliefs from other check nodes and variable nodes connected to the stopping set 400 to overcome. As message passing continues within the stopping set 400, the confidence of the stopping set 400 in its belief of the LLRs increases to a point where any external beliefs will no longer be able to make any correction to the bits. As such, if all the bits within the stopping set 400 are in error, the check nodes in the stopping set 400 form a very strong opinion that the bits are not in error and any external beliefs that any of the bits are in error will be considered weaker than the strength of the opinion of the stopping set 400 and the attempt of the external beliefs to correct the beliefs of the stopping set 400 will be unsuccessful. In a binary erasure channel (BEC) the value of the receive bit is guaranteed, unless the bit is not received (i.e. erased). In the case of a binary erasure channel (BEC), if each variable node contained in the stopping set 400 begins the decoding process with an erasure from the channel, none of the check nodes connected to the stopping set 400 will be capable of resolving the erasures and a decode failure will occur.

Figure 5:
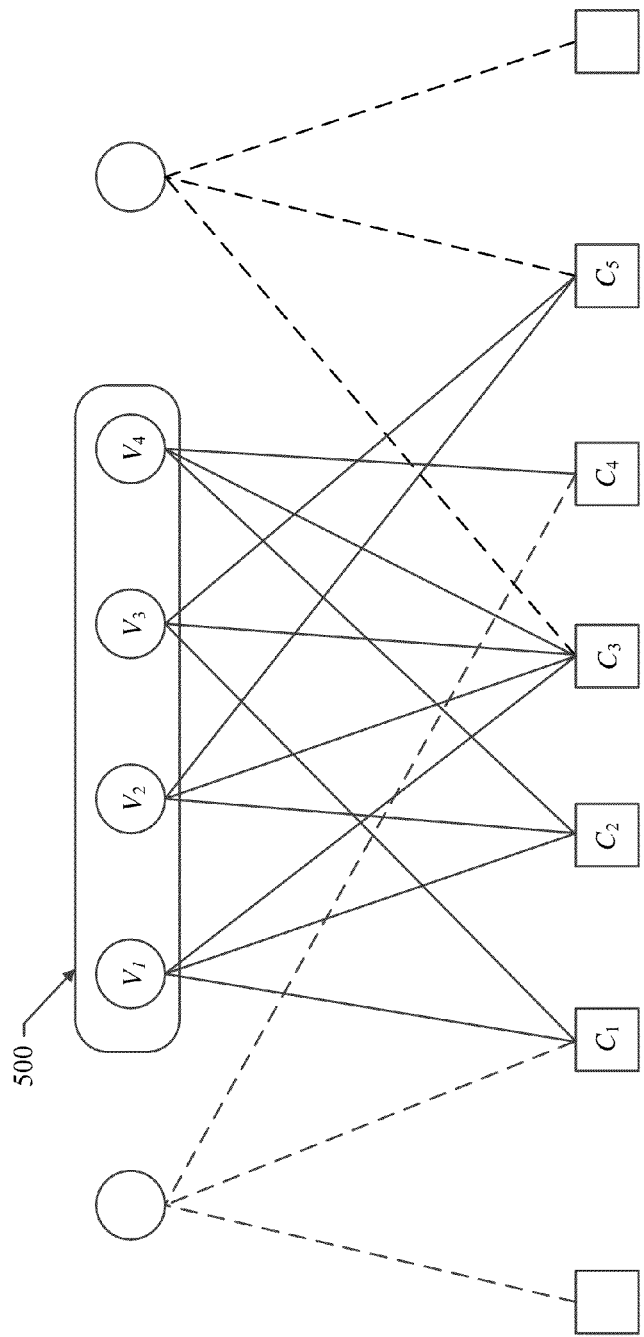
FIG. 5 is an illustration of a Tanner Graph of a trapping set in an LDPC code.

Trapping sets are generally defined as a configuration of a subset of the set of variable nodes in a matrix with check nodes of odd degrees. A trapping set traps an iterative decoder and represents an error pattern that is not correctable by the decoder. The influence of these error mechanisms on the decoding process is a result of both the properties of the H matrix and the decoding algorithm used, as well as the error vector resulting from the channel-noise. An exemplary trapping set 500 is illustrated with reference to FIG. 5. In the Tanner graph of this trapping set 500, there are four variable nodes in the trapping set 500 and check node $C_2$ and $C_4$ are connected to the trapping set an odd number of times (i.e. odd degree). A trapping set affects the ability of the decoder to decode the encoded codeword as a result of highly unreliable information regarding the reliability of the codeword LLRs being propagated to other variable nodes in the trapping set during the first few iterations of belief propagation. As such, when the reliability of the LLR is initially overestimated by the variable nodes in the trapping set and the variable nodes have significantly biased their decision towards the incorrect value of the codeword LLRs, the unreliable information cannot be overcome by the iterative process and the errors remain trapped within this set of variable nodes until the end of the decoding process, resulting in a decoding failure.

Stopping sets and trapping sets are dynamic in their evolution. While the sub-structures of the error mechanisms may inherently exist in the structure of the H matrix, the probability that these sub-structures will lead to a decode failure is dependent upon the progression of the belief iteration through the stopping sets or trapping sets during the decode process. This progression is dependent upon the error vector, the behavior of the iterative decoding scheme used and the quantization of rational numbers in the digital implementation. Due to these compounding factors, it is extremely difficult to identify and predict if stopping sets and trapping sets will occur during an LDPC decode process utilizing a specific H matrix. Since the stopping sets and trapping sets affect the error correction capability of a particular H matrix, it is impossible to accurately determine whether a particular H matrix is sufficient for achieving a particular error correction rate. As such, it is desirable to avoid these stopping sets and trapping sets during the decode process in order to attain a desired error correction ability.

Figure 6:
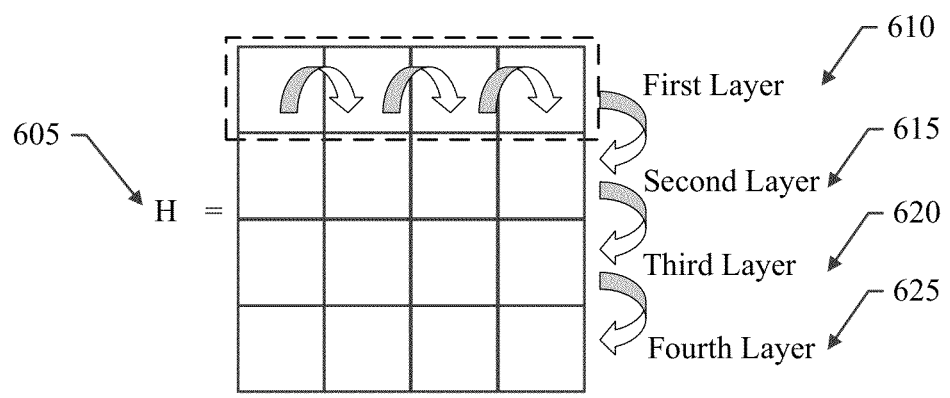
FIG. 6 is an illustration of a parity check matrix (H) in accordance with an embodiment of the present invention.

During the layered belief propagation decoding process, such as layered min-sum and layered sum-product, each layer of the parity check matrix (H) is processed in sequential order. In the exemplary embodiment illustrated in FIG. 6A, a parity check matrix (H) 605 may comprise 4 layers, wherein a layer 610 may be equivalent to one circulant row for a quasi-cyclic LDPC code having a circulant row weight equal to "1", meaning that only one "1" appears in any row or any column of the matrix (H). In another embodiment, when the weight of a circulant row is greater than "1", a layer may be smaller than a circulant row. As such, it is within the scope of the present invention that there may be multiple layers in a circulant row of the matrix (H) if the weight of the circulant row is greater than "1". In general, a layer may be considered the largest number of rows of the matrix (H) that never connects a variable node to multiple check nodes.

Due to the nature of stopping sets and trapping sets, the order in which the layers of the parity check matrix are processed has an effect on whether or not these error mechanisms are formed during the iterative decoding process. In the present invention, the order in which the layers are processed during the iterative decoding is altered between decode attempts in an effort to disrupt the formation of stopping set and trapping sets. As such, in the present invention, the layers of the H matrix are dynamically reordered during the decoding process to provide the option of attempting a decode retry with a different order of layers, subsequent to a decode failure. The decode retry processes the layers of the H matrix in a different order so as to try and avoid another decode failure due to the formation of the same stopping sets and trapping sets. By performing a decode retry using a different ordering of the H matrix layers, the slower alternatives of flash read retry and RAID (Redundant Array of Independent Disks) mechanisms can be avoided.

Referring again to FIG. 6, assuming a parity check matrix (H) 605 comprises 4 layers, first layer 610, second layer 615, third layer 620 and fourth layer 625, in a first attempt at decoding a received codeword, the H matrix may be traversed in the standard order given, first layer 610, second layer 615, third layer 620 and fourth layer 625. If a decode failure results, it can be assumed that the failure is a result of the undesirable formation of an error mechanism, such as a stopping set or a trapping set. As such, the order in which the layers are processed may be changed and a decode retry can be attempted for the received codeword using the new order of layers. In an exemplary embodiment, the third layer 620 may be processed first, followed by the first layer 610, then the fourth layer 625 and finally the second layer 615. Any reordering of the layers is within the scope of the present invention. However, it is realized that changing the ordering to avoid processing the layers in the same sequence is beneficial to the success of the decoding process since it is assumed that the order of the processing of the layers is responsible for the error mechanisms.

The reordering or the processing layers of the parity check matrix of the present invention may be used to improve the performance of the LDPC decoder in decoding LDPC encoded data that is stored in a nonvolatile memory system. As shown with reference to FIG. 7, a nonvolatile memory system 700, such as a solid state drive, may include a nonvolatile storage module 715 and a nonvolatile memory controller 705. The nonvolatile memory storage module 715 may comprise a plurality of NAND chips 730. Each of the plurality of NAND chips 730 may be coupled to the nonvolatile memory controller 705 through a plurality of channels 720. In this embodiment, the NAND chips 730 store the encoded codewords and the memory controller 705 is designed to execute reading and writing controls for the NAND chips 730 according to reading and writing instructions received from an access device.

Figure 7:
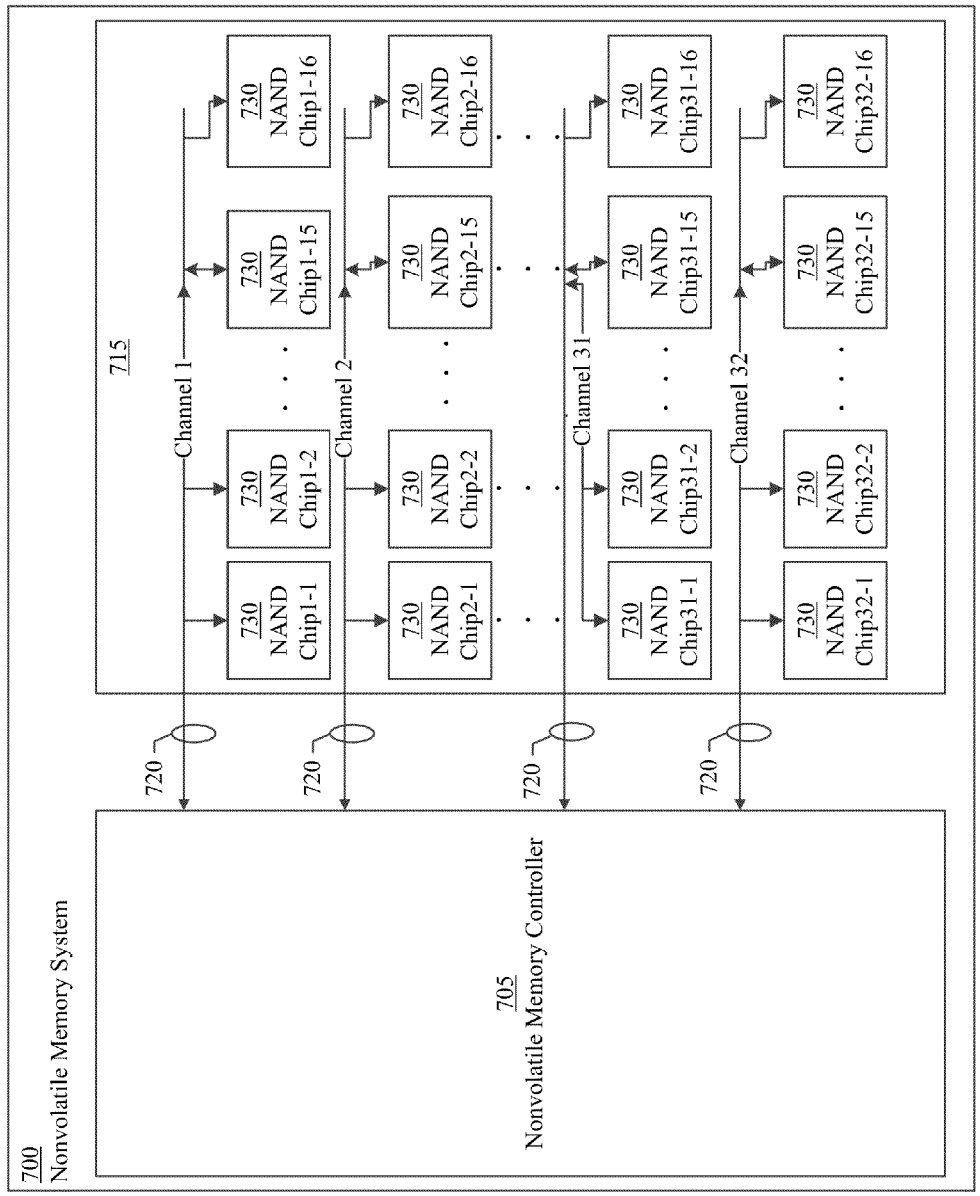
FIG. 7 is a block diagram illustrating a nonvolatile memory system.
Figure 8:
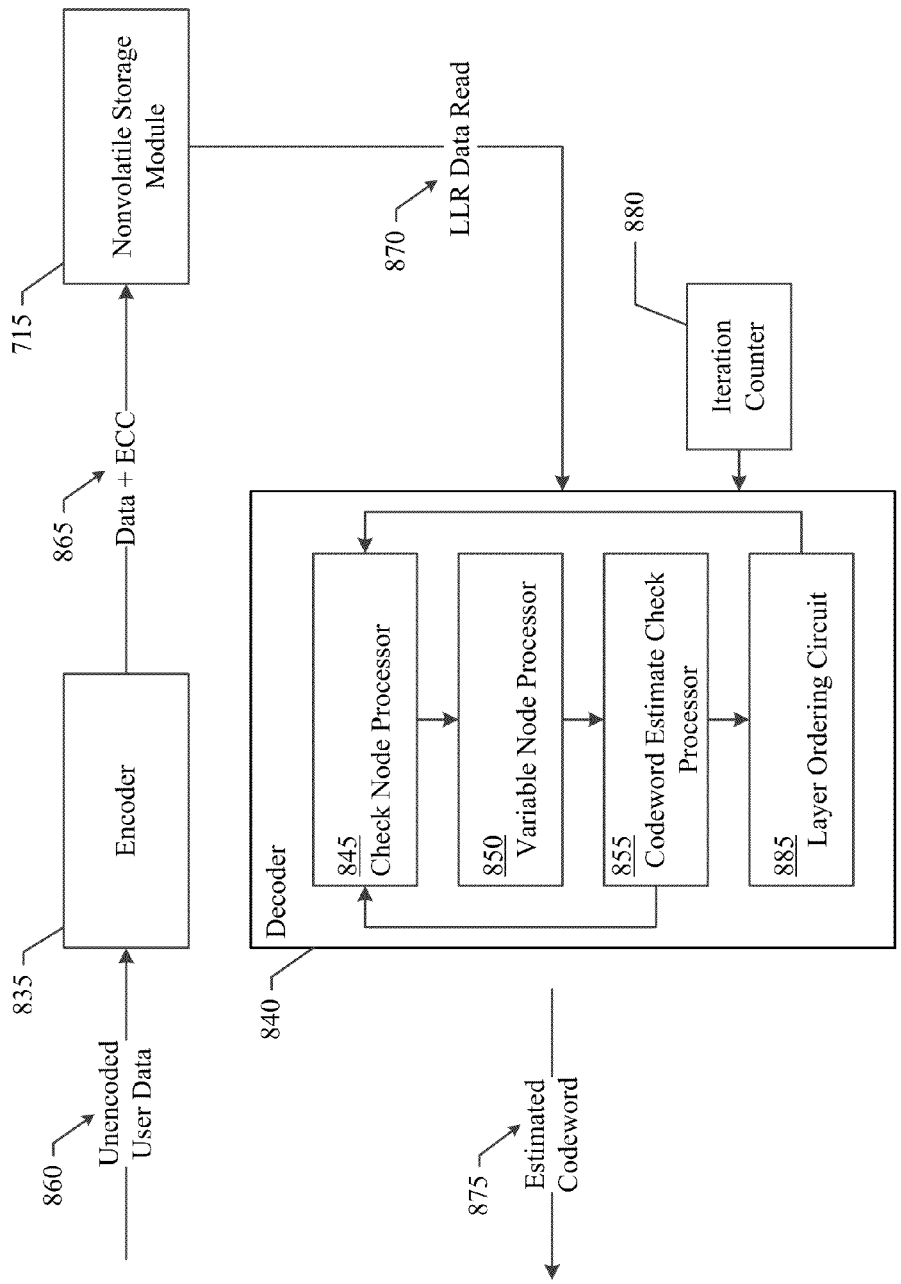
FIG. 8 is a block diagram illustrating LDPC encoding and LDPC decoding in accordance with an embodiment of the present invention.

The nonvolatile storage module 715 of FIG. 7 may be incorporated into a LDPC system as shown with reference to FIG. 8. As shown, the LDPC system may comprise an encoder 835 that is responsible for adding the parity bits to the unencoded user data 860 in accordance with a low-density parity check (LDPC) code. The LDPC encoded data 865, which includes the unencoded user data 860 and an error correction code, may then be stored as encoded codewords in the nonvolatile storage module 715. In a particular embodiment the nonvolatile storage module 715 may include a plurality of NAND chips 730. The nonvolatile storage module 715 and a nonvolatile memory controller 705 may be included in a nonvolatile memory system 700 as previously described with reference to FIG. 7.

In the present invention, LDPC decoding of the codeword is performed based upon the parity check matrix having a plurality of layers and a layer ordering circuit to determine the order in which the plurality of layers of the parity check matrix are to be processed. The parity check matrix consists of "0"s and "1"s defining the parity check equations. For an "M" row×"N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix. The present invention employs a layered decoding technique in which message updates are performed after the completion of each layer of the parity check matrix. A layer may be defined as a single row of the parity check matrix, or as a group of rows of the parity check matrix. The layer ordering circuit 885 determines the order in which the layers of the parity check matrix will be processed. Additionally, the layer ordering circuit 885 can change the order during the decoding process as necessary to avoid error mechanisms, such as stopping sets and trapping sets.

In operation of the present invention, in a first decode attempt to read the data from the nonvolatile storage module 715, a single read of the stored codewords is executed to provide hard decision LLRs 870. The hard decision LLRs 870 are used as input to the LDPC decoder 840 to decode the unencoded user data 860 as encoded by the encoder 835, utilizing LDPC coding following a parity check matrix (H) having a plurality of layers. The received LLR values for each variable node are taken as the initial variable node messages. In a first iteration, the check node processor 845 updates the check nodes of a first layer with the variable node messages they are connected to, wherein the first layer is defined by the layer ordering circuit 885. The resulting messages of the check node processor 845 are then passed to the variable node processor 850 and the variable node processor 850 then updates each variable node with the check node messages to which they are connected. After each iteration, a codeword estimate check processor 855 checks the codeword estimate to verify whether or not the codeword estimate is a valid codeword. If the codeword estimate is not a valid codeword and a maximum number of iterations, as identified by the iteration counter 880, has not been reached, the iterative decoding process continues at the second layer, as defined by the layer ordering circuit 885. The decoding process continues in this way, following the ordering of layers as identified by the layer ordering circuit 885. In a particular embodiment, the codeword estimate may be multiplied by the parity check matrix to determine the syndrome and if the syndrome is zero, it may be determined that the codeword estimate is a valid codeword. During the iterative decoding process, if the codeword estimate is determined to be a valid codeword, the decoding is complete and the estimated codeword is provided as output 875 from the decoder 840. If, during the iterative decoding process, it is determined by the codeword estimate check processor 855 that the codeword estimate is not a valid codeword and the maximum number of iterations has been reached, as determined by the iterative counter 880, the layer ordering circuit 885 selects a different processing order of layers than was used in the first decode attempt and the iterative decoding process attempts to decode the LLRs in a second decode attempt using a different processing order of layers than was used in the first decode attempt. As such, in the present invention, a decode retry can be attempted using a single read of the nonvolatile storage module 715 and a rearranged order of the iterative layers without having to re-read the nonvolatile storage module 715.

If the decode attempt utilizing the hard decision LLRs acquired with a single read of the nonvolatile storage module 715 is unsuccessful at arriving at a valid codeword, multiple reads of the nonvolatile storage module 715 may be used in an attempt to decode the stored codewords. In operation of the present invention, during a read operation of the nonvolatile storage module 715, multiple reads of the stored codewords are executed to provide soft information represented by LLRs 870 as previously described. The LLRs 870 are used as input to the LDPC decoder 840 to decode the unencoded user data 860 encoded by encoder 835, utilizing LDPC coding following a parity check matrix (H) having a plurality of layers. The received LLR values for each variable node are taken as the initial variable node messages. In a first iteration, the check node processor 845 updates the check nodes of a first layer with the variable node messages they are connected to, wherein the first layer is defined by the layer ordering circuit 885. The resulting messages of the check node processor 845 are then passed to the variable node processor 850 and the variable node processor 850 then updates each variable node with the check node messages to which they are connected. After each iteration, a codeword estimate check processor 855 checks the codeword estimate to verify whether or not the codeword estimate is a valid codeword. If the codeword estimate is not a valid codeword and a maximum number of iterations, as identified by the iteration counter 880, has not been reached, the iterative decoding process continues at the second layer, as defined by the layer ordering circuit 885. The decoding process continues in this way, following the ordering of layers as identified by the layer ordering circuit 885, resulting in a codeword estimate. In a particular embodiment, the codeword estimate may be multiplied by the parity check matrix to determine the syndrome and if the syndrome is zero, it may be determined that the codeword estimate is a valid codeword. If the codeword estimate is a valid codeword, the decoding is complete and the estimated codeword is provided as output 875 from the decoder 840. If, during the iterative decoding process, it is determined by the codeword estimate check processor 855 that the codeword estimate is not a valid codeword and the maximum number of iterations has been reached, as determined by the iterative counter 880, the layer ordering circuit 885 selects a different processing order of layers than was used in the first decode attempt and the iterative decoding process attempts to decode the LLRs in a second decode attempt using a different processing order of layers than was used in the first decode attempt. As such, in the present invention, a decode retry can be attempted using the soft information from the plurality of reads of the nonvolatile storage module 715 and a rearranged order of the iterative layers without having to re-read the soft information from the nonvolatile storage module 715. In a specific embodiment, the encoder 835 and decoder 840 may be included in the nonvolatile memory controller 705.

Figure 9:
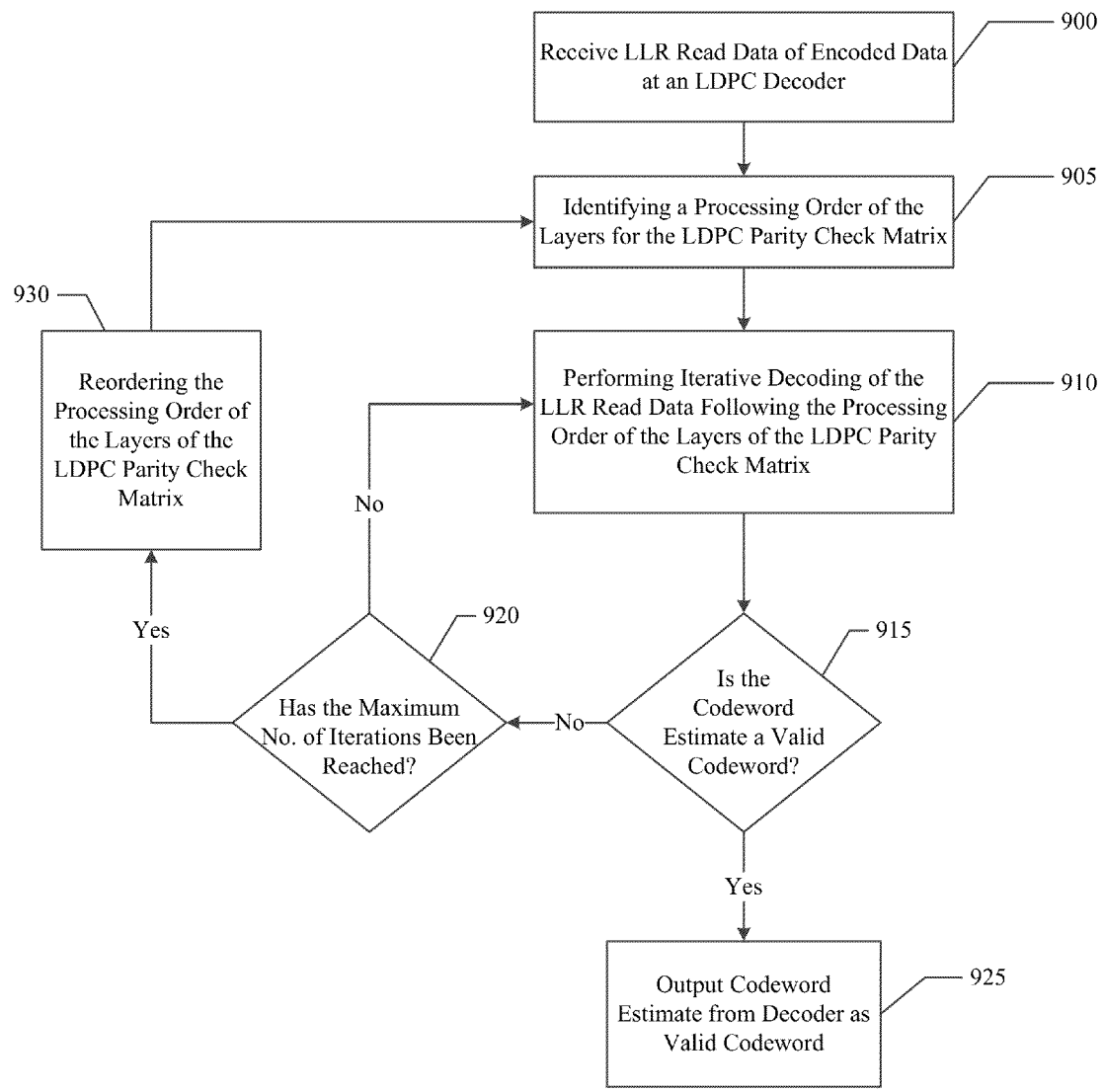
FIG. 9 is a flow diagram illustrating the decoding method in accordance with an embodiment of the present invention.

With reference to FIG. 9, in a particular embodiment of the present invention, LLR read data of the LDPC encoded data may be received at an LDPC decoder 900. In a particular embodiment, the LLRs may be read from a nonvolatile memory storage, such as a solid state drive (SSD) comprising a plurality of NAND chips. As previously described, iterative decoding is performed using the LLRs of the LDPC codeword. During the iterative decoding process, a processing order of the layers of the parity check matrix is identified 905 by the layer ordering circuit 885 and iterative decoding of the LLR read data is performed following the processing order of the layers of the parity check matrix 910 using the check node processor 845 and the variable node processor 850 of the decoder 840 to produce a codeword estimate based upon the check node processing and variable node processing. The codeword estimate check processor 855 of the decoder 840 then checks to verify that the codeword estimate is a valid codeword 915. If the codeword estimate is determined to be a valid codeword, the codeword estimate is transmitted from the decoder as an estimated codeword 925. However, if the codeword estimate is not determined to be a valid codeword, and the maximum number of iterations has not been reached 920, the iterative decoding continues with the next layer following the processing order of the layers. If a valid codeword does not result after the maximum number of iterations has been reached 920, the layer ordering circuit 885 reorders the processing order of the layers of the parity check matrix 930 and a next attempt of the decoding process is initiated beginning with the initial LLR read data 905 following the reordered processing order of the layers of the parity check matrix.

While the various embodiments of the present invention are described as applicable to LDPC decoding, it is within the scope of the present invention to utilize the present invention to avoid error mechanisms in other iterative decoding processes, as are known in the art.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for avoiding an error mechanism during the decoding of encoded data, the method comprising:
   receiving a plurality of log-likelihood ratios (LLRs) at a decoder, each of the plurality of LLRs representing one of a plurality of bits of a codeword encoded using a parity check matrix having a plurality of layers;
   performing iterative decoding of the plurality of LLRs utilizing a layered iterative decoding process following a first processing order of the plurality of layers of the parity check matrix to provide a codeword estimate of the encoded codeword until the codeword estimate is determined to be a valid codeword or until a maximum number of iterations of the iterative decoding is reached using the first processing order of the plurality of layers of the parity check matrix; and
   if a maximum number of iterations of the iterative decoding is reached and the codeword estimate is not determined to be a valid codeword, performing iterative decoding of the plurality of LLRs utilizing a layered iterative decoding process following a second processing order of the plurality of layers of the parity check matrix, wherein the second processing order of the plurality of layers of the parity check matrix is a different processing order than the first processing order of layers, to provide a codeword estimate of the encoded codeword until the codeword estimate is determined to be a valid codeword or until the maximum number of iterations of the iterative decoding is reached using the second processing order of the plurality of layers of the parity check matrix.

2. The method of claim 1, wherein the codeword is a low density parity check (LDPC) encoded codeword and the layered iterative decoding process is an LDPC decoding process.

3. The method of claim 1, wherein receiving the LLRs further comprises receiving the LLRs from a nonvolatile memory storage module.

4. The method of claim 1, wherein the layered iterative decoding process is a layered min-sum decoding process.

5. The method of claim 1, wherein the layered iterative decoding process is a sum-product decoding process.

6. The method of claim 1, wherein the error mechanism is selected from the group consisting of a stopping set and a trapping set.

7. The method of claim 1, wherein performing iterative decoding may be performed over multiple iterations and wherein a different processing order of the plurality of layers of the parity check matrix is followed for each iteration of the layered iterative decoding process.

8. The method of claim 1, wherein performing iterative decoding of the LLRs utilizing a layered iterative decoding process following a first processing order of the plurality of layers of the parity check matrix to provide a codeword estimate of the encoded codeword, further comprises:
   performing check node processing for each layer of the parity check matrix associated with the encoded codeword following the first processing order of the plurality of layers of the parity check matrix;

performing variable node processing for each layer of the parity check matrix following the first processing order of the plurality of layers of the parity check matrix; and performing a check of the codeword estimate of the encoded codeword to determine if the codeword estimate is a valid codeword.

9. The method of claim 1, wherein performing iterative decoding of the LLRs utilizing a layered iterative decoding process following a second processing order of the plurality of layers of the parity check matrix to provide a codeword estimate of the encoded codeword, further comprises:

performing check node processing for each layer of the parity check matrix associated with the encoded codeword following the second processing order of the plurality of layers of the parity check matrix;

performing variable node processing for each layer of the parity check matrix following the second processing order of the plurality of layers of the parity check matrix; and performing a check of the codeword estimate of the encoded codeword to determine if the codeword estimate is a valid codeword.

10. The method of claim 1, where each layer is identified as one or more circulant rows in the parity check matrix associated with the encoded codeword.

11. A decoder for decoding encoded data, the encoded data comprising a plurality of log-likelihood ratios (LLRs), each of the plurality of LLRs representing one of a plurality of bits of a codeword encoded using a parity check matrix having a plurality of layers, the decoder comprising circuitry for:

performing iterative decoding of the plurality of LLRs utilizing a layered iterative decoding process following a first processing order of the plurality of layers of the parity check matrix to provide a codeword estimate of the encoded codeword until the codeword estimate is determined to be a valid codeword or until a maximum number of iterations of the iterative decoding is reached using the first processing order of the plurality of layers of the parity check matrix; and if a maximum number of iterations of the iterative decoding is reached and the codeword estimate is not determined to be a valid codeword, performing iterative decoding of the plurality of LLRs utilizing a layered iterative decoding process following a second processing order of the plurality of layers of the parity check matrix, wherein the second processing order of the plurality of layers of the parity check matrix that is a different processing order than the first processing order of layers, to provide a codeword estimate of the encoded codeword until the codeword estimate is determined to be a valid codeword or until the maximum number of iterations of the iterative decoding is reached using the second processing order of the plurality of layers of the parity check matrix.

12. The decoder of claim 11, wherein the codeword is a low density parity check (LDPC) encoded codeword and the layered iterative decoding process is an LDPC decoding process.

13. The decoder of claim 11, further comprising an iteration counter to determine if the maximum number of iterations of the iterative decoding is reached.

14. The decoder of claim 11, further comprising a layer ordering circuit for determining the first processing order and the second processing order of the plurality of layers of the parity check matrix.

15. The decoder of claim 11, wherein the layered iterative decoding process is a layered min-sum decoding process.

16. The decoder of claim 11, wherein the layered iterative decoding process is a layered sum-product decoding process.

17. The decoder of claim 11, wherein the error mechanism is selected from the group consisting of a stopping set and a trapping set.

18. The decoder of claim 11, wherein performing iterative decoding may be performed over multiple iterations and wherein the layer ordering circuit identifies a different processing order of the plurality of layers of the parity check matrix to be followed for each iteration of the layered iterative decoding process.

19. The decoder of claim 11, wherein the circuitry for performing decoding of the LLRs utilizing a layered iterative decoding process following a first processing order of the plurality of layers of the parity check matrix to provide a codeword estimate of the encoded codeword, further comprises:

a check node processor having circuitry for performing check node processing for each layer of the parity check matrix associated with the encoded codeword following the first processing order of the plurality of layers of the parity check matrix;

a variable node processor coupled to the check node processor, the variable node processor having circuitry for performing variable node processing for each layer of the parity check matrix following the first processing order of the plurality of layers of the parity check matrix; and a codeword estimate check processor coupled to the variable node processor, the codeword estimate check processor having circuitry for performing a check of the codeword estimate of the encoded codeword to determine if the codeword estimate is a valid codeword.

20. The decoder of claim 11, where each layer comprises one or more rows in the parity check matrix associated with the encoded codeword.

21. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix having a plurality of layers, the decoder comprising:

decoding circuitry for performing iterative decoding of the plurality of LLRs utilizing a layered iterative decoding process following a first processing order of the plurality of layers of the parity check matrix to provide a codeword estimate of the encoded codeword until the codeword estimate is determined to be a valid codeword or until a maximum number of iterations of the iterative decoding is reached using the first processing order of the plurality of layers of the parity check matrix; and if a maximum number of iterations of the iterative decoding is reached and the codeword estimate is not determined to be a valid codeword, performing iterative decoding of the plurality of LLRs utilizing a layered iterative decoding process following a second processing order of the plurality of layers of the parity check matrix, wherein the second processing order of the plurality of layers of the parity check matrix is a different processing order than the first processing order of layers, to provide a codeword estimate of the encoded codeword until the codeword estimate is determined to be a valid codeword or until the maximum number of iterations of the iterative decoding is reached using the second processing order of the plurality of layers of the parity check matrix; and a layer ordering circuit coupled to the decoding circuitry, the layer ordering circuit for determining the first processing order of the plurality of layers of the parity check matrix and for determining the second processing order of the plurality of layers of the parity check matrix.

\* \* \* \* \*